(12) United States Patent
Nabetani

(10) Patent No.: US 7,288,937 B2
(45) Date of Patent: Oct. 30, 2007

(54) IMAGE GENERATING METHOD AND MRI APPARATUS

(75) Inventor: Akira Nabetani, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/112,124

(22) Filed: Apr. 22, 2005

(65) Prior Publication Data

US 2005/0237056 A1    Oct. 27, 2005

(30) Foreign Application Priority Data

Apr. 23, 2004  (JP)  .............................. 2004-128008
May 14, 2004  (JP)  .............................. 2004-144350

(51) Int. Cl.
*G01V 3/00* (2006.01)

(52) U.S. Cl. ....................................... 324/309; 324/307
(58) Field of Classification Search ................ 324/309, 324/307, 306, 312
See application file for complete search history.

(56) References Cited

U.S. PATENT DOCUMENTS

| 4,731,865 | A |   | 3/1988 | Sievenpiper |
| 4,812,753 | A |   | 3/1989 | Fuderer et al. |
| 5,659,629 | A |   | 8/1997 | Cline |
| 5,945,826 | A | * | 8/1999 | Leussler ...................... 324/309 |
| 6,326,786 | B1 | * | 12/2001 | Pruessmann et al. ....... 324/312 |
| 6,483,308 | B1 | * | 11/2002 | Ma et al. ...................... 324/312 |
| 6,528,998 | B1 | * | 3/2003 | Zhou et al. .................. 324/309 |
| 6,559,642 | B2 |   | 5/2003 | King |
| 6,650,925 | B2 | * | 11/2003 | Wang .......................... 600/410 |
| 6,668,184 | B1 |   | 12/2003 | Kleiman |
| 6,771,067 | B2 | * | 8/2004 | Kellman et al. ............. 324/307 |
| 6,841,998 | B1 | * | 1/2005 | Griswold ..................... 324/309 |
| 6,949,928 | B2 |   | 9/2005 | Gonzalez Ballester et al. |
| 2004/0070394 | A1 |   | 4/2004 | Gonzalez Ballester et al. |

FOREIGN PATENT DOCUMENTS

| JP | 2003 265432 | 9/2003 |
| JP | 2004 144350 | 5/2004 |
| WO | 02056767 | 7/2002 |

OTHER PUBLICATIONS

Pruessmann et al.: "SENSE: Sensitivity Encoding for Fast MRI," Magnetic Resonance in Medicine 42:952-962 (1999), pp. 952-962.
An English translation of JP 2003-265432.
An English translation of JP 2004-144350.

* cited by examiner

*Primary Examiner*—Louis M. Arana
(74) *Attorney, Agent, or Firm*—Armstrong Teasdale LLP

(57) ABSTRACT

A method of generating an MR image based on respective data obtained by n ($\geq 2$) coils, respective low resolution images are generated using partial data in a low frequency region for the data obtained by the n coils. The intensities and phases of the low resolution images are corrected. The post-correction images are added together to generate one composite low resolution image. Sensitivity maps of the respective coils are created from the composite low resolution image and the respective low resolution images. One image is generated from the respective data and the respective sensitivity maps.

15 Claims, 12 Drawing Sheets

IMAGE GENERATING METHOD AND MRI APPARATUS

CROSS REFERENCE TO RELATED APPLICATIONS

This application claims the benefit of Japanese Application No. 2004-128008 filed Apr. 23, 2004 and Japanese Application No. 2004-144350 filed May 14, 2004.

BACKGROUND OF THE INVENTION

The present invention relates to an image generating method and an MRI (Magnetic Resonance Imaging) apparatus, and more specifically to an image generating method and an MRI apparatus capable of generating an MR image excellent in image quality, based on respective data obtained by n ($\geq 2$) coils.

One MR image has heretofore been generated by a sum of square method based on respective data obtained by coils of a phased array coil. However, a satisfactory image cannot be obtained due to variations in sensitivity of each coil. Therefore, there has been proposed a method of acquiring data by a body coil having uniform sensitivity to thereby create a reference image, and correcting the sensitivity of each coil using the reference image (refer to, for example, the following patent document 1).

There has been also proposed a method of generating images from respective data obtained by n coils and sensitivity maps of the respective coils (see, for example, the following non-patent document 1).

[Patent Document 1] U.S. Pat. No. 4,812,753

[Non-Patent Document 1] Pruessmann K P, et al. Magn Reson Med 1999; 952-962

The conventional method of correcting the sensitivity, based on the reference image generated from the data obtained using the body coil is accompanied by the problem that the acquisition of data by the body coil is needed in addition to the acquisition of data by the phased array coil. Also a problem arises in that when a patient moves during the periods of the acquisition of the data by the phased array coil and the acquisition of the data by the body coil, an artifact is generated.

Further, the known method of generating the images from the respective data obtained by the n coils and the sensitivity maps of the respective coils is accompanied by the problem that although the sensitivity maps of the respective coils are required, the acquisition of data by a body coil is required in addition to the acquisition of data by a phased array coil to create the sensitivity maps. When a patient moves during the periods of the acquisition of the data by the phased array coil and the acquisition of the data by the body coil, an artifact occurs.

SUMMARY OF THE INVENTION

Therefore, an object of the present invention is to provide an image generating method and an MRI apparatus both capable of generating an MR image excellent in picture quality, based on respective data obtained by n coils.

According to a first aspect, the present invention provides an image generating method comprising the steps of generating respective images from respective data obtained by n ($\geq 2$) coils, correcting intensities and phases of the respective images, and thereafter adding the images to generate one composite or combined image.

In the image generating method according to the first aspect, the intensities and phases of the respective images generated from the data obtained by the n coils are corrected and the corrected images are added. Therefore, an image excellent in image quality, which is equivalent to an image generated from data obtained by one large coil high in the degree of uniformity, can be obtained. Thus, there is no need to obtain the data by one large coil high in the degree of uniformity.

According to a second aspect, the present invention provides an image generating method comprising the steps of generating respective images from respective data obtained by n ($\geq 2$) coils, correcting intensities and phases of the respective images, thereafter adding the respective images to generate one composite image, creating sensitivity maps of the respective coils from the composite image and the respective images, and generating one image from the respective data and the respective sensitivity maps.

In the image generating method according to the second aspect, the intensities and phases of the respective images generated by the data obtained by the n coils are corrected and the corrected images are added together. Therefore, a combined or composite image equivalent to an image generated from data obtained by one large coil high in the degree of uniformity, can be obtained. The sensitivity maps of the respective coils can be created from the composite image and the respective images. Further, an image excellent in image quality is obtained because one image is generated from the respective data and the respective sensitivity maps. There is no need to obtain the data by one large coil high in the degree of uniformity.

According to a third aspect, the present invention provides an image generating method wherein in the image generating method having the above construction, respective low resolution images are generated using partial data in a low frequency region, of the data obtained by the n coils, the intensities and phases of the respective low resolution images are corrected, thereafter the images are added together to generate one composite low resolution image, and sensitivity maps of the respective coils are created from the composite low resolution image and the low resolution images.

In the image generating method according to the third aspect, the sensitivity maps of the respective coils are created based on the partial data in the low frequency region, of the respective data in addition to the ability to suppress sensitivity variations in a manner similar to the image generated from the data obtained by one large coil high in the degree of uniformity. Therefore, it is possible to eliminate the influence of high-frequency noise and obtain a high SNR (Signal to Noise Ratio) similar to the data obtained by the n coils.

According to a fourth aspect, the present invention provides an image generating method wherein in the image generating method having the above construction, a test signal is inputted to portions corresponding to receiving terminals of the n coils, a phase shift amount and an intensity correction coefficient corresponding to each coil are determined and stored from each of the obtained test data, and the intensity and phase of each image are corrected using them.

In the image generating method according to the fourth aspect, variations in phase and variations in signal intensity due to cables, pre-amplifiers, receivers and the like from the receiving terminals of the respective coils to data sampling terminals are actually measured. The phase shift amounts and the intensity correction coefficients are determined and stored in advance. The intensities and phases of the respective images are corrected using them upon actual photographing. Therefore, a process at the actual photographing or imaging becomes simple.

According to a fifth aspect, the present invention provides an image generating method wherein in the image generating method having the above construction, a first composite signal P(1) of pixel groups for a first low resolution image corresponding to an object to be photographed located at an equal distance from a first coil and kth (where k=2, . . . , n) coils, and a kth composite signal P(k) of pixel groups for a kth low resolution image are compared to thereby determine intensity correction coefficients and phase shift amounts corresponding to the kth coils, and the intensities and phases of the respective low resolution images are corrected using them.

The first composite signal P(1) of the pixel groups for the first low resolution image corresponding to the object to be photographed located at the equal distance from the first coil and kth coils, and the kth composite signal P(k) of the pixel groups for the kth low resolution image are theoretically identical in intensity and are placed in a phase-constant relationship.

Thus, in the image generating method according to the fifth aspect, the phase shift amount and the intensity correction coefficient can be determined by comparing the first composite signal P(1) with the kth composite signal P(k).

According to a sixth aspect, the present invention provides an image generating method wherein in the image generating method having the above construction, an intensity correction coefficient is determined from a ratio between the magnitude of the first composite signal P(1) and the magnitude of the kth composite signal P(k).

The first composite signal P(1) of the pixel group for the first low resolution image corresponding to a signal source located at an equal distance from the first coil and kth coils, and the kth composite signal P(k) of the pixel group for the kth low resolution image are theoretically identical in intensity.

Thus, in the image generating method according to the sixth aspect, the intensity correction coefficient can be determined by comparing the magnitude of the first composite signal P(1) with the magnitude of the kth composite signal P(k).

According to a seventh aspect, the present invention provides an image generating method wherein in the image generating method having the above construction, both the first composite signal P(1) and the kth composite signal P(k) are added while the phase of one thereof is being shifted, and a shift amount in which a value reaches the maximum is set as a phase shift amount.

The first composite signal P(1) of the pixel group for the first low resolution image corresponding to the signal source located at the equal distance from the first coil and kth coils, and the kth composite signal P(k) of the pixel group for the kth low resolution image are theoretically identical in phase.

Thus, in the image generating method according to the seventh aspect, the phase shift amount can be determined by making a comparison between the first composite signal P(1) and the kth composite signal P(k).

According to an eighth aspect, the present invention provides an image generating method wherein in the image generating method having the above construction, the images are multiplied by weights based on the arrangements of the respective coils thereby to add the images.

The data obtained by the respective coils associated with the same signal source are constant in intensity and phase according to the layouts of the respective coils.

Thus, in the image generating method according to the eighth aspect, the images are multiplied by weights determined according to relative intensities and relative phases corresponding to the arrangements of the respective coils thereby to add the images.

According to a ninth aspect, the present invention provides an MRI apparatus comprising n ($\geqq$2) coils, image reconstructing means which generates respective images from respective data obtained by the n ($\geqq$2) coils, correcting means which corrects the intensities and phases of the respective images, and composite image generating means which adds the post-correction images to generate one composite image.

The MRI apparatus according to the ninth aspect is capable of suitably executing the image generating method according to the first aspect.

According to a tenth aspect, the present invention provides an MRI apparatus comprising n ($\geqq$2) coils, image reconstructing means which generates respective images from respective data obtained by the n ($\geqq$2) coils, correcting means which corrects the intensities and phases of the respective images, composite image generating means which adds the post-correction images to generate one composite image, sensitivity map creating means which creates sensitivity maps of the respective coils from the composite image and the respective images, and image generating means which generates one image from the respective data and the respective sensitivity maps.

The MRI apparatus according to the tenth aspect is capable of suitably executing the image generating method according to the second aspect.

According to an eleventh aspect, the present invention provides an MRI apparatus wherein in the MRI apparatus having the above configuration, the image reconstructing means generates respective low resolution images, using partial data in a low frequency region, of the data obtained by the n coils, the correcting means corrects the intensities and phases of the respective low resolution images, the composite image generating means adds the post-correction images to generate one composite low resolution image, and the sensitivity map generating means creates sensitivity maps of the respective coils from the composite low resolution image and the respective low resolution images.

The MRI apparatus according to the eleventh aspect is capable of suitably carrying out the image generating method according to the third aspect.

According to a twelfth aspect, the present invention provides and MRI apparatus wherein in the MRI apparatus having the above configuration, correction value storing means which stores pre-determined phase shift amounts and intensity correction coefficients corresponding to the respective coils, is provided and the correcting means corrects the intensities and phases of the respective images, using the stored phase shift amounts and intensity correction coefficients.

The MRI apparatus according to the twelfth aspect is capable of suitably carrying out the image generating method according to the fourth aspect.

According to a thirteenth aspect, the present invention provides an MRI apparatus wherein in the MRI apparatus having the above configuration, correction value acquiring means is provided which compares a first composite signal P(1) of pixel groups for a first low resolution image corresponding to an object to be photographed located at an equal distance from a first coil and kth (where k=2, . . . , n) coils, and a kth composite signal P(k) of pixel groups for a kth low resolution image to thereby acquire intensity correction coefficients and phase shift amounts corresponding to the kth coils, and the correcting means corrects the intensities and phases of the respective images, using the acquired phase shift amounts and intensity correction coefficients.

The MRI apparatus according to the thirteenth aspect is capable of suitably executing the image generating method according to the fifth aspect.

According to a fourteenth aspect, the present invention provides an MRI apparatus wherein in the MRI apparatus having the above configuration, the correction value acquiring means determines an intensity correction coefficient from a ratio between the magnitude of the first composite signal $P(1)$ and the magnitude of the kth composite signal $P(k)$.

The MRI apparatus according to the fourteenth aspect is capable of suitably executing the image generating method according to the sixth aspect.

According to a fifteenth aspect, the present invention provides an MRI apparatus wherein in the MRI apparatus having the above configuration, the correction value acquiring means adds both the first composite signal $P(1)$ and the kth composite signal $P(k)$ while the phase of one thereof is being shifted, and sets a shift amount in which a value reaches the maximum, as a phase shift amount.

The MRI apparatus according to the fifteenth aspect is capable of suitably executing the image generating method according to the seventh aspect.

According to a sixteenth aspect, the present invention provides an MRI apparatus wherein in the MRI apparatus having the above configuration, the composite image generating means multiplies the images by weights based on the arrangements of the respective coils thereby to add the images.

The MRI apparatus according to the sixteenth aspect is capable of suitably executing the image generating method according to the eighth aspect.

According to the image generating method and MRI apparatus of the present invention, an image high in the degree of uniformity can be generated as compared with the conventional sum-of-square method. The acquisition of data by the use of a body coil becomes unnecessary. As a result, a scan time can be shortened. The present invention resists even an artifact developed depending on the motion of a patient. Further, since the sensitivity of each coil is corrected based on the emulation of the sensitivity of a large coil, a correction to a diseased part as in the correction of an image by image processing is no longer made.

An image generating method and an MRI apparatus according to the present invention can be used in MR imaging using a plurality of coils.

Further objects and advantages of the present invention will be apparent from the following description of the preferred embodiments of the invention as illustrated in the accompanying drawings.

DETAILED DESCRIPTION OF THE INVENTION

The present invention will hereinafter be described in further detail by embodiments illustrated in the accompanying drawings. Incidentally, the present invention is not limited by these.

EMBODIMENT 1

Figure 1:
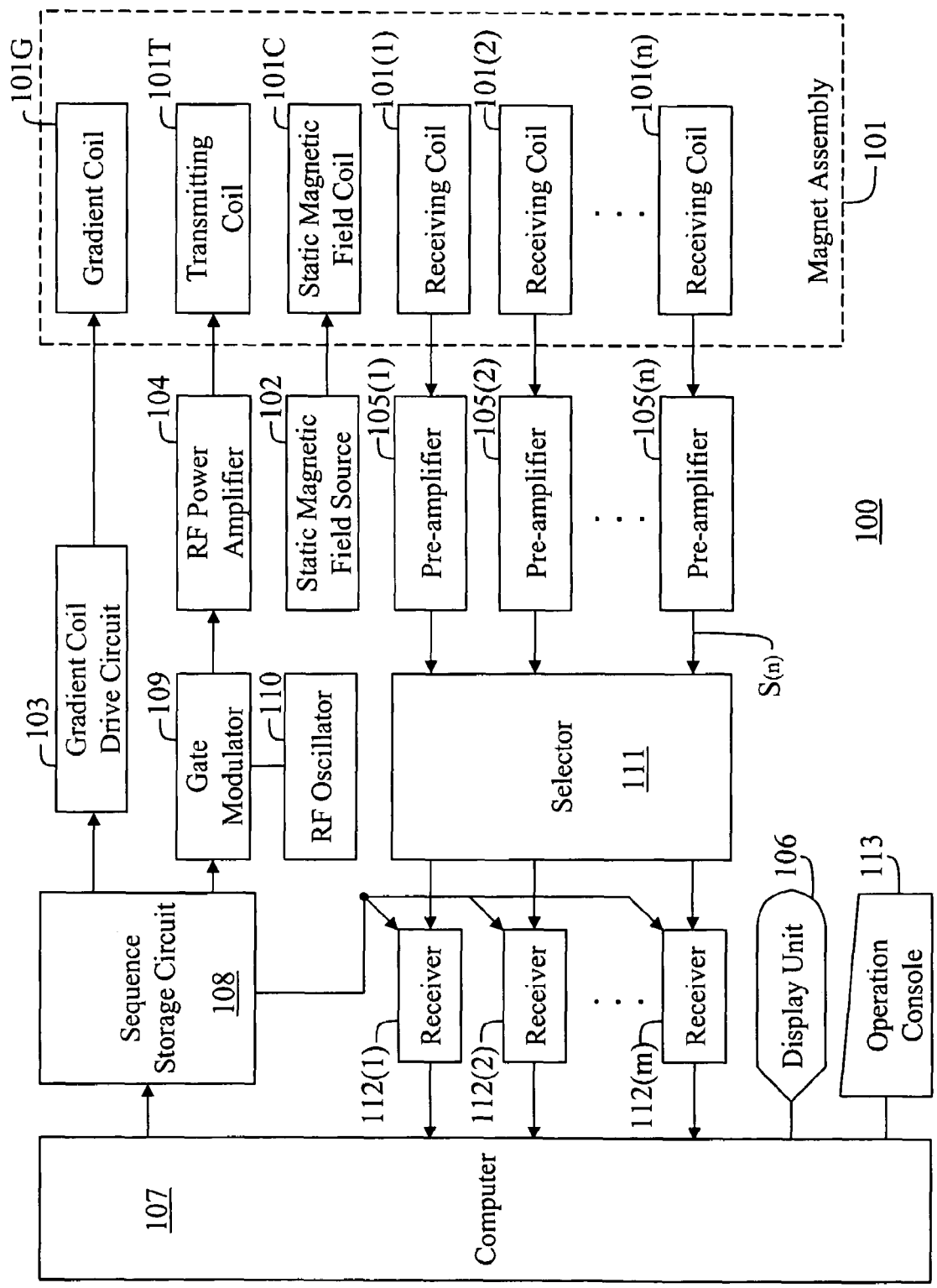
FIG. 1 is a block diagram showing an MRI apparatus according to an embodiment 1.

FIG. 1 is a block diagram showing an MRI apparatus 100 according to an embodiment 1.

In the MRI apparatus 100, a magnet assembly 101 has a spatial portion (bore) for inserting a sample thereinside. A static magnetic field coil 101C for applying a constant static magnetic field to the sample, a gradient or slope coil 101G for generating gradient or slope magnetic fields for an X axis, a Y axis and a Z axis, a transmitting coil 101T for supplying an RF pulse for exciting the spin of a nucleus in the sample, and n-channel receiving coils 101(1), 101(2), ..., 101(n) for receiving an NMR signal from the sample are disposed in the magnet assembly 101 so as to surround the spatial portion.

Incidentally, a slice axis, a phase encode axis and a lead axis are formed by combinations of the X axis, Y axis and Z axis of the gradient coil 101G of the magnet assembly 101.

The static magnetic field coil 101C, the gradient coil 101G and the transmitting coil 101T are respectively connected to a static magnetic field source 102, a gradient coil drive circuit 103 and an RF power amplifier 104. The receiving coils 101(1), 101(2), ..., 101(n) are respectively connected to pre-amplifiers 105(1), 105(2), ..., 105(n).

Incidentally, a permanent magnet may be used in place of the static magnetic field coil 101C.

A sequence storage circuit 108 controls or operates the gradient coil drive circuit 103, based on a pulse sequence stored therein in accordance with instructions given from a computer 107 to thereby generate a gradient magnetic field from the gradient coil 101G. Further, the sequence storage circuit 108 operates a gate modulator 109 to modulate a carrier output signal produced from an RF oscillator 110 to a pulsated signal represented in the form of a predetermined timing, predetermined envelope and a predetermined phase and add it to the RF power amplifier 104 as an RF pulse, where it is power-amplified, followed by application to the transmitting coil 101T.

A selector 111 transfers NMR signals received by the receiving coils 101(1), 101(2), . . . , 101(n) and amplified by the pre-amplifiers 105(1), 105(2), . . . , 105(n) to m receivers 112(1), 112(2), . . . , 112(m) respectively. This is done to vary relationships among the receiving coils 101 and the receivers 112.

The receivers 112 convert the NMR signals to digital signals and input them to the computer 107.

The computer 107 reads the digital signals from the receivers 112 and processes the same to thereby produce or generate an MR image. Also the computer 107 takes charge of the entire control such as the reception of information inputted through an operation console 113.

A display unit 106 displays an image and messages thereon.

Figure 2:
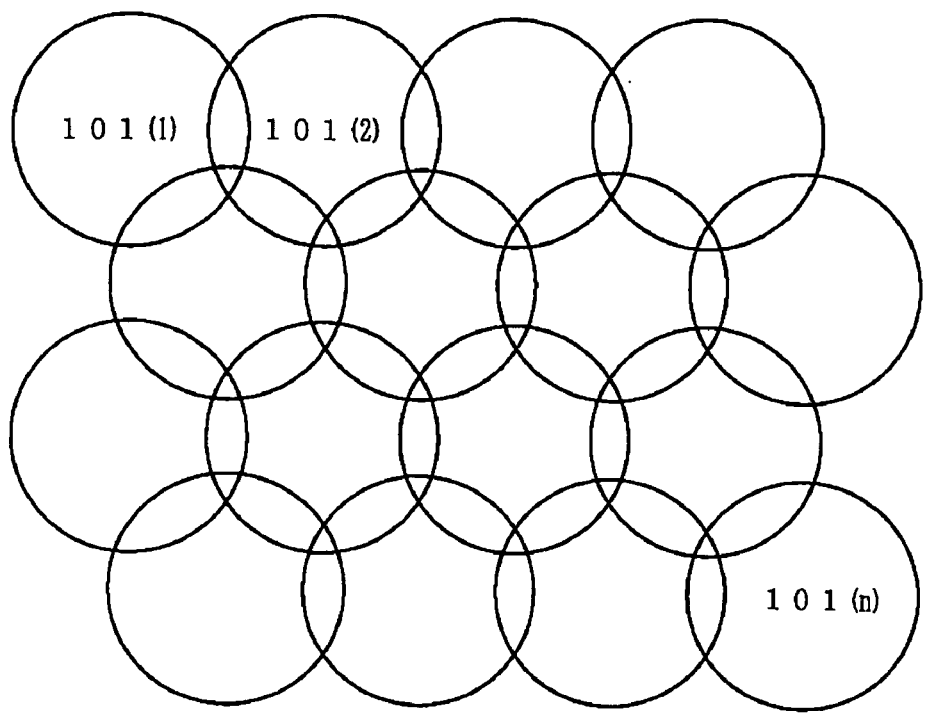
FIG. 2 is a plan view illustrating a phased array coil according to the embodiment 1.

FIG. 2 is a plan view of a phased array coil in which the coils 101(1), 101(2), . . . , 101(n) each having the same shape are arranged on the plane.

Figure 3:
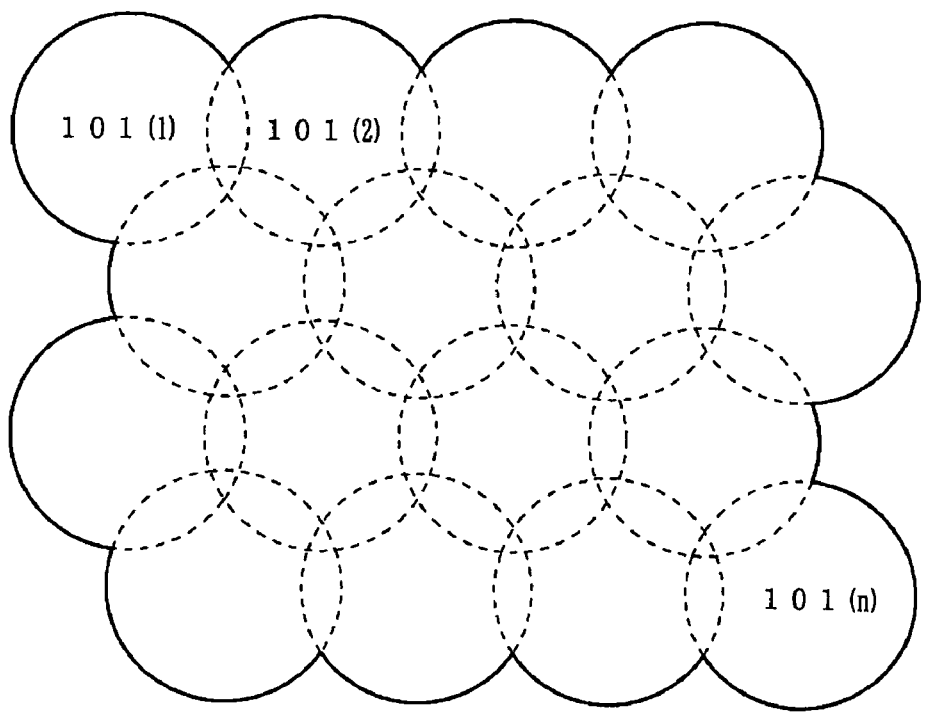
FIG. 3 is a conceptual diagram showing a large coil emulated by the embodiment 1.

FIG. 3 is a conceptual diagram showing one large coil emulated by a process to be next described.

Figure 4:
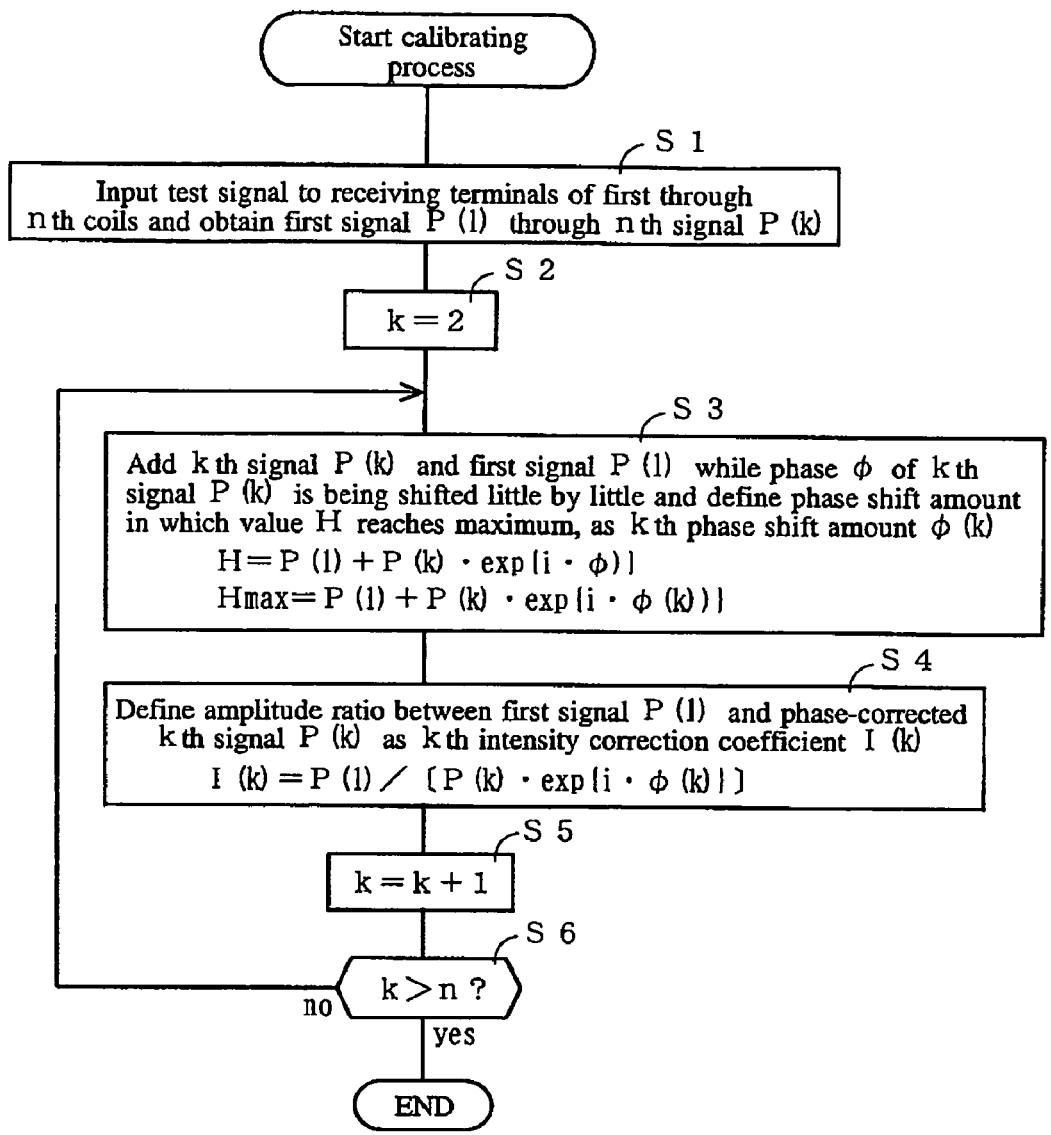
FIG. 4 is a flow chart showing a calibrating process according to the embodiment 1.

FIG. 4 is a flow chart showing a calibrating process according to the embodiment 1.

In Step S1, an operator inputs a small test signal to receiving terminals (connecting points of coils and cables) of a first coil 101(1), a second coil 101(2), . . . , an nth coil 101(n) in phase and with the same amplitude. Then, the computer 107 reads data of a first signal P(1), a second signal P(2), . . . , an nth signal P(k).

In Step S2, a coil number counter is initially set to k=2.

In Step S3, the kth signal P(k) and the first signal P(1) are added together while the phase φ of the kth signal P(k) is being changed by a unit shift amount (10° by 10°, for example). A phase shift amount at which a value H reaches the maximum, is defined as a kth phase shift amount φ(k).

$$H = P(1) + P(k) \cdot \exp\{i \cdot \varphi\}$$

$$H\max = P(1) + P(k) \cdot \exp\{i \cdot \varphi(k)\}$$

In Step S4, the ratio between the amplitude of the first signal P(1) and that of the phase-corrected kth signal P(k) is defined as a kth intensity correction coefficient I(k).

$$I(k) = P(1) / [P(k) \cdot \exp\{i \cdot \varphi(k)\}]$$

In Step S5, the coil number counter k is incremented by "1". If the coil number counter k≦n in Step S6, then the calibrating process returns to Step S3. If k>n, then the calibrating process is terminated.

According to the calibrating process of the embodiment 1, the phase shift amount φ(k) and the intensity correction coefficient I(k) are stored in the computer 107.

Figure 5:
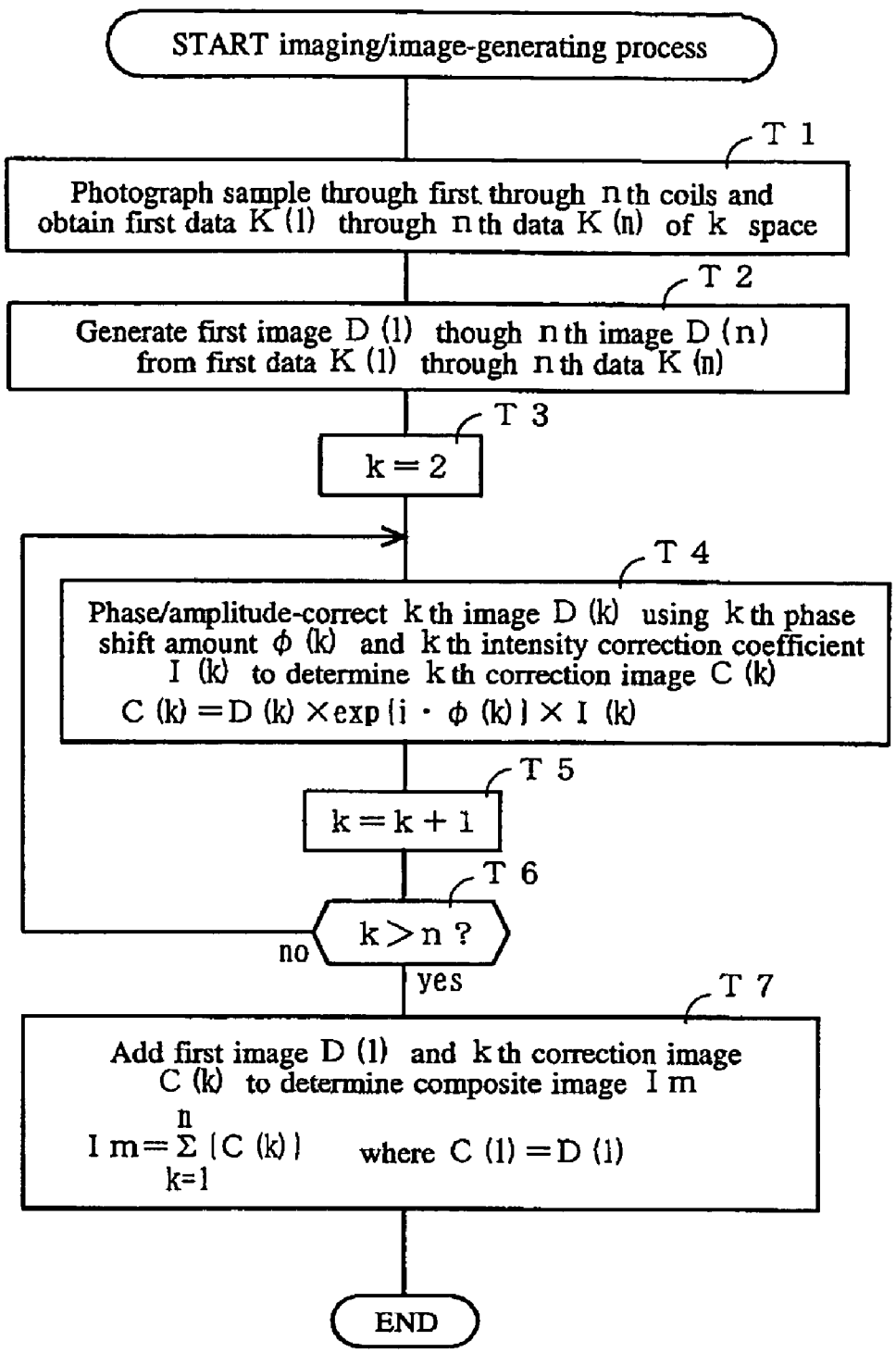
FIG. 5 is a flow chart illustrating an imaging/image-generating process according to the embodiment 1.

FIG. 5 is a flow chart showing an imaging/image-generating process according to the embodiment 1.

In Step T1, a sample or a body to be examined is imaged using the first coil 101(1), second coil 101(2), . . . , nth coil 101(n), and first data K(1), second data K(2), . . . , nth data K(n) for a k space are read into the computer 107.

In Step T2, a first image D(1), a second image D(2), . . . , an nth image D(n) are reconstructed from the first data K(1), second data K(2), . . . , nth data K(n). Incidentally, these images are complex images, and their pixel values are equivalent to vectors and have phases and magnitude.

In Step T3, the coil number counter is initially set to k=2.

In Step T4, the respective pixel values of a kth image D(k) are phase/amplitude-corrected using the kth phase shift amount φ(k) and the kth intensity correction coefficient I(k) to obtain a kth correction image C(k).

$$C(k) = D(k) \times \exp\{i \cdot \varphi(k)\} \times I(k)$$

In Step T5, the coil number counter k is incremented by "1". If the coil number counter k≦n in Step T6, then the process returns to Step T4. If k>n, then the process proceeds to Step T7.

In Step T7, the first image D(1) and all corrected images are added together to obtain a composite image Im.

$$Im = \Sigma\{C(k)\}$$

where C(1)=D(1). Then, the process is terminated.

According to the imaging/image-generating process of the embodiment 1, an image having the degree of uniformity equivalent to the image generated from the data obtained by the large coil shown in FIG. 3 can be generated.

EMBODIMENT 2

Figure 6:
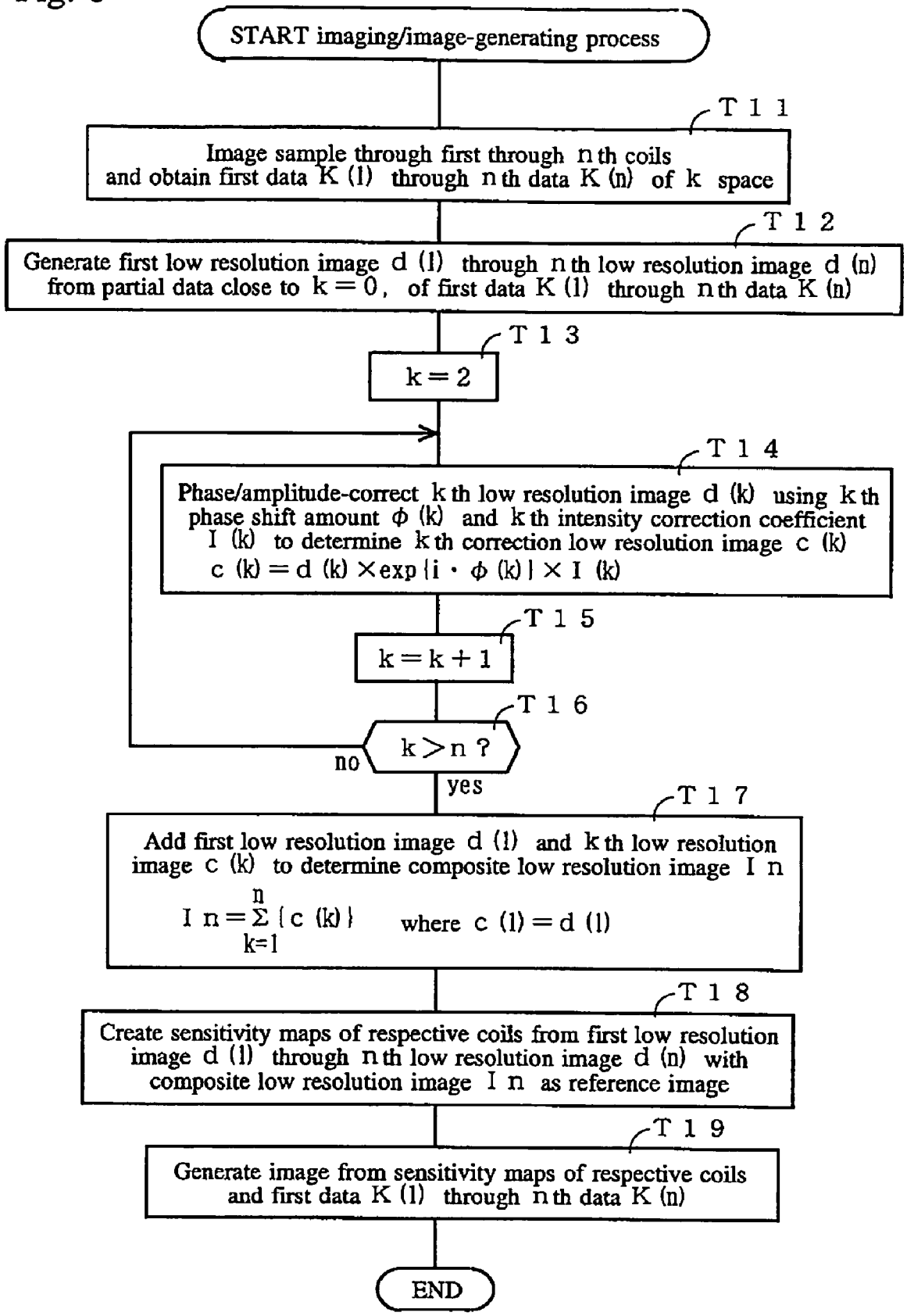
FIG. 6 is a flow chart showing an imaging/image-generating process according to an embodiment 2.

FIG. 6 is a flow chart showing an imaging/image-generating process according to an embodiment 2.

In Step T11, a sample is imaged using a first coil 101(1), a second coil 101(2), . . . , an nth coil 101(n), and first data K(1), second data K(2), . . . , nth data K(n) for a k space are read into a computer 107.

In Step T12, a first low resolution image d(1), a second low resolution image d(2), . . . , an nth low resolution image d(n) are reconstructed from partial data close to k=0 (equivalent to about 32 lines near k=0 in the case of a resolution of 256×256, for example), of the first data K(1), second data K(2), . . . , nth data K(n). Incidentally, these images are complex images, and their pixel values are equivalent to vectors and have phases and magnitude.

In Step T13, a coil number counter is initially set to k=2.

In Step T14, the respective pixel values of a kth low resolution image d(k) are phase/amplitude-corrected using a kth phase shift amount φ(k) and a kth intensity correction coefficient I(k) to thereby obtain a kth correction low resolution image c(k).

$$c(k) = d(k) \times \exp\{i \cdot \varphi(k)\} \times I(k)$$

In Step T15, the coil number counter k is incremented by "1".

If the coil number counter k≦n in Step T16, then the imaging/image-generating process returns to Step T14. If k>n, then the imaging/image-generating process proceeds to Step T17.

In Step T17, the first low resolution image d(1) and all corrected low resolution images are added together to determine a composite low resolution image In.

$$In = \Sigma\{c(k)\}$$

where c(1)=d(1).

In Step T18, sensitivity maps of the respective coils are created or generated from the first low resolution image d(1) through nth low resolution image d(n) with the composite low resolution image In as a reference image. For example, images obtained by dividing the respective pixel values of the first low resolution image d(1) through nth low resolution image d(n) by the sizes or magnitudes of respective pixels of the composite low resolution image In are set as sensitivity maps. Alternatively, images obtained by effecting smoothing processing on the divided images to remove noise therefrom are set as sensitivity maps.

In Step T19, an image is generated from the sensitivity maps of the first coil 101(1), second coil 101(2), . . . , nth coil 101(n), and the first data K(1), second data K(2), . . . , nth data K(n). This image generation can be performed using the following expression disclosed in Pruessmann K P, et al. Magn Reson Med 1999; 952-962.

$$(S^H\Psi^{-1}S)^{-1}S^H\Psi^{-1}A$$

where S indicate vectors in which the sensitivity maps of the respective coils are arranged in order. $\Psi$ indicates a noise correlation matrix. When no noise correlation matrix is used, $\Psi$ is defined as a unit matrix. A indicate data of the respective coils. This calculation is done every pixels. Then, the present process is terminated.

According to the imaging/image-generating process of the embodiment 2, an image having the degree of uniformity equivalent to the image generated from the data obtained by the large coil shown in FIG. 3 and having a high SNR showing the advantage of the phased array coil can be generated.

Incidentally, the image may be formed in the following manner.

(1) In Step T11, a reference scan (e.g., scan for image of 32×32) is performed through the first coil 101(1), second coil 101(2), . . . , nth coil 101(n) to obtain first data K(1), second data K(2), . . . , nth data K(n) for reference, of the k space. Further, a phase encode step is thinned out and the present scan (e.g., scan for image of 256×256) is done to obtain first data K(1), second data K(2), . . . , nth data K(n) for imaging, of the k space.

(2) In Step T12, the first data K(1), second data K(2), . . . , nth data K(n) are used as they are.

(3) In Step T19, the first data K(1), second data K(2), . . . , nth data K(n) for imaging are used together with the sensitivity maps of the respective coils to generate an image in accordance with a SENSE (Sensitivity Encoding) algorithm.

Alternatively, the image may be formed in the following manner.

(1) In Step T11, the phase encode step is not thinned out with respect to only a region close to k=0 at the first coil 101(1), second coil 101(2), . . . , nth coil 101(n). The phase encode step is thinned out in regions other than it and photographing or imaging is done thereat to obtain first data K(1), second data K(2), . . . , nth data K(n) of the k space.

(2) In Step T19, an image is generated in accordance with the SENSE algorithm, using data obtained by thinning out even the phase encode step in the region close to k=0 from the first data K(1), second data K(2), . . . , nth data K(n) together with the sensitivity maps of the respective coils.

EMBODIMENT 3

Figure 7:
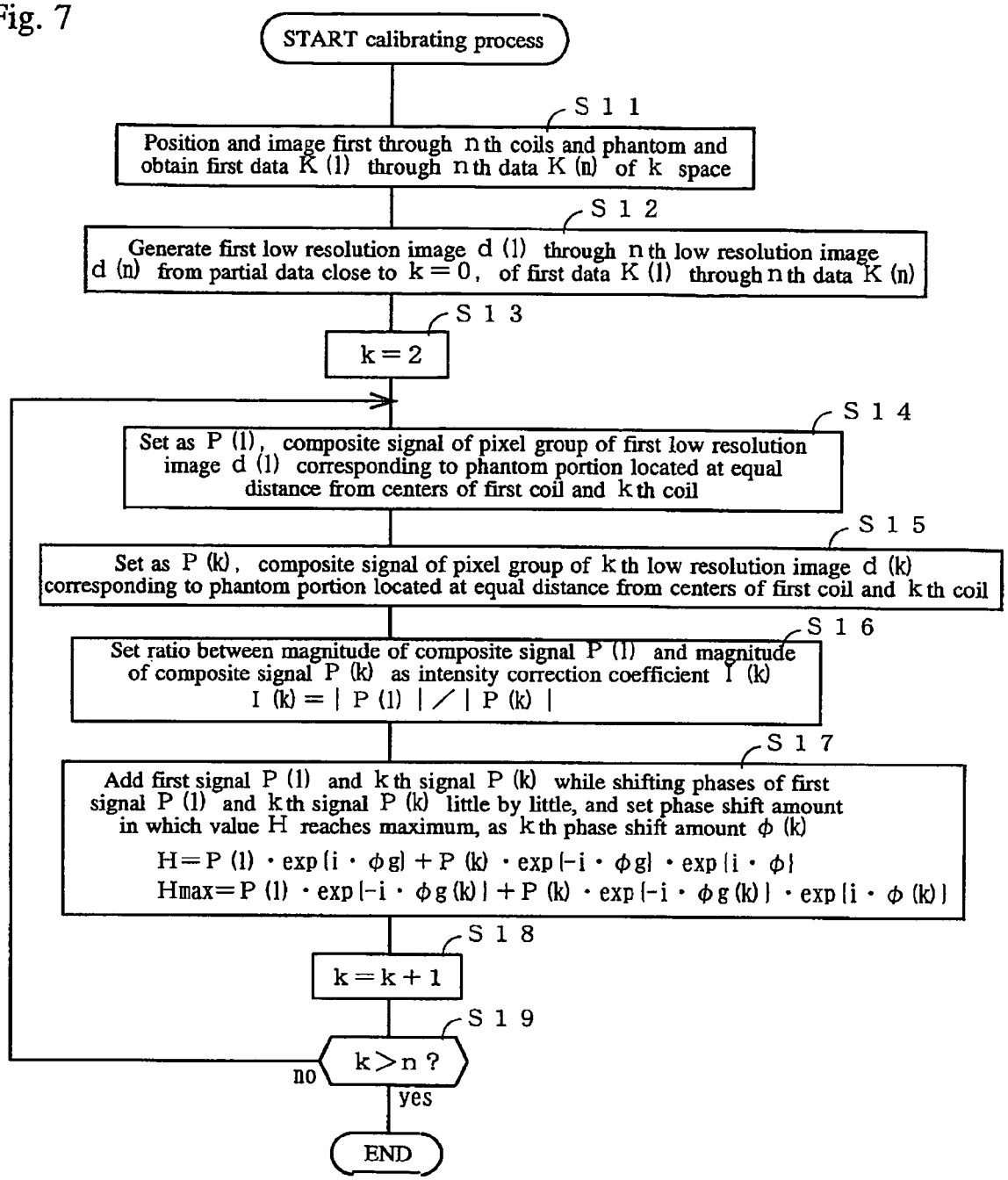
FIG. 7 is a flow chart illustrating a calibrating process according to an embodiment 3.

FIG. 7 is a flow chart showing a calibrating process according to an embodiment 3.

In Step S11, an operator positions and images or photographs a first coil 101(1), second coil 101(2), . . . , nth coil 101(n) and a phantom, and reads first data K(1), second data K2), . . . , nth data K(n) of a k space into a computer 107.

In Step S12, a first low resolution image d(1), a second low resolution image d(2), . . . , nth low resolution image d(n) are reconstructed from partial data close to k=0 (equivalent to about 32 lines near k=0 in the case of a resolution of 256×256, for example), of the first data K(1), second data K(2), . . . , nth data K(n). Incidentally, these images are complex images, and their pixel values are equivalent to vectors and have phases and magnitude.

In Step S13, a coil number counter is initially set to k=2.

Figure 8:
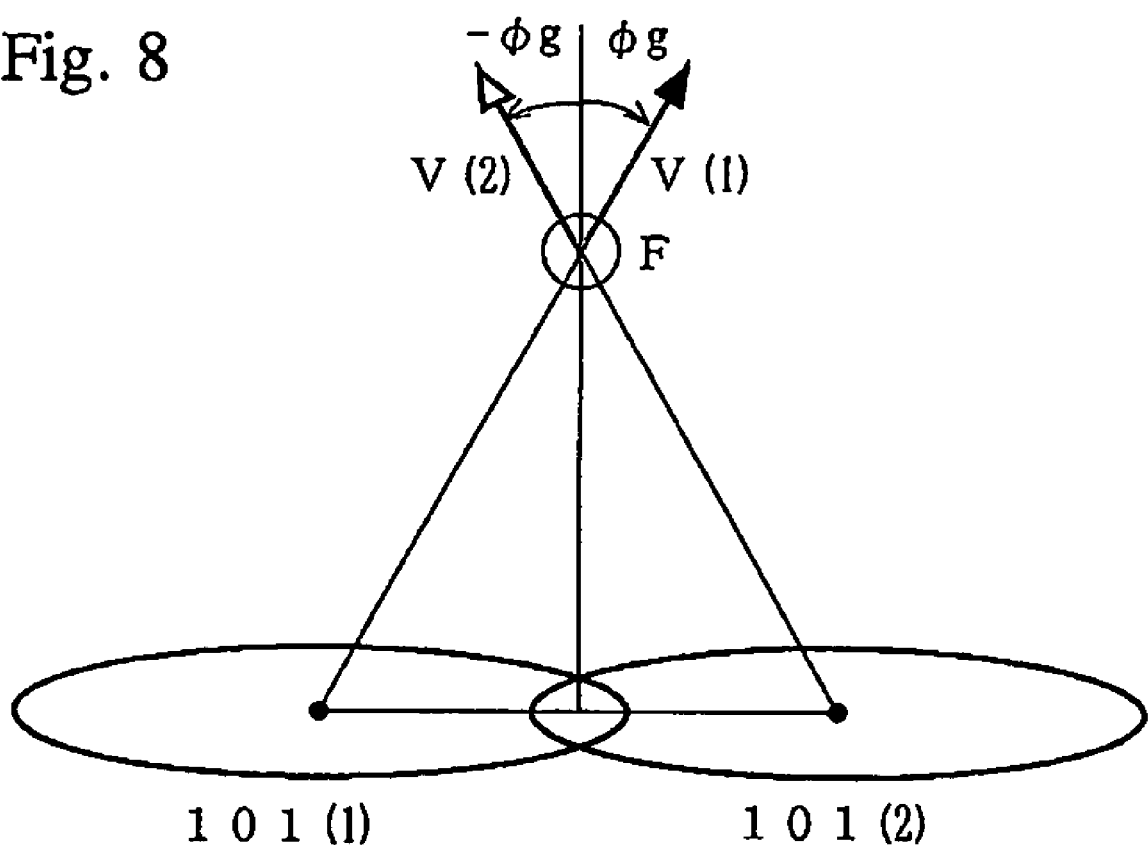
FIG. 8 is an explanatory view showing sensitivity vectors of coils.

In Step S14, a composite signal (vector obtained by adding vectors of respective pixels) of a pixel group (about 30×30 pixels in the case of a resolution of 256×256, for example) of the first low resolution image d(1) corresponding to a phantom portion F located at an equal distance from the centers of the first coil 101(1) and the kth coil 101(k) in the case of k=2 as shown in FIG. 8 is defined or set as P(1).

In Step S15, a composite signal of a pixel group of the kth low resolution image d(k) corresponding to a phantom portion F located at an equal distance from the centers of the first coil 101(1) and the kth coil 101(k) in the case of k=2 as shown in FIG. 8 is defined or set as P(k).

In Step S16, the ratio between the magnitude of the composite signal P(1) and that of the composite signal P(k) is defined or set as a kth intensity correction coefficient I(k).

$$I(k)=|P(1)|/|P(k)|$$

Meanwhile, there are phase differences between the composite signal P(1) of the first coil 101(1) and the composite signal P(k) of the kth coil 101(k) due to the following three factors.

(i) A phase difference developed due to the difference between a transmission line from the receiving terminal of the first coil 101(1) to the receiver 112(1) and a transmission line from the receiving terminal of the kth coil 101(k) to the receiver 112(k).

(ii) A phase difference developed due to the fact that an NMR signal is a rotating magnetic field and the first coil 101(1) and the kth coil 101(k) are different in position.

(iii) A phase difference developed due to the fact that the sensitivity vector V(1) of the first coil 101(1) and the sensitivity vector V(k) of the kth coil 101(k) are different in direction in the case of k=2 as shown in FIG. 8.

In order to emulate a large coil, there is a need to match time bases of currents flowing through the respective coils with one another. That is, there is a need to perform a phase correction so as to eliminate the phase differences of the above (i) and (ii) and hold the phase difference of the above (iii).

Thus, in Step S17, when a phase shift amount for determining the combined phase difference of the above (i) and (ii) is defined as $\phi$ and a phase shift amount for determining the phase difference of the above (iii) is defined as $\phi g$, $\phi$ is changed 10° by 10° for example in a range of 0° through 360°, and $\phi g$ is changed 2.5° by 2.5° in a range of 0° through 90° (difference in direction of sensitivity vector is less than 90°). Then, a phase shift amount $\phi$ in which the value H of the following expression reaches the maximum, is defined or set as a kth phase shift amount $\phi(k)$.

$$H=P(1)\cdot\exp\{i\cdot\phi g\}+P(k)\cdot\exp\{-1\cdot\phi g\}\cdot\exp\{i\cdot\phi\}$$

$$H\max=P(1)\cdot\exp\{i\cdot\phi g(k)\}+P(k)\cdot\exp\{-i\cdot\phi g(k)\}\cdot\exp\{i\cdot\phi(k)\}$$

In Step S18, the coil number counter k is incremented by "1". If the coil number counter k≦n in Step S19, then the calibrating process returns to Step S14. If k>n, then the calibrating process is completed.

According to the calibrating process of the embodiment 3, the phase shift amount $\phi(k)$ and the intensity correction coefficient I(k) are stored in the computer 107.

Incidentally, the kth intensity correction coefficient I(k) and the kth phase shift amount $\phi(k)$ with the first coil 101(1) as the reference have been obtained by the comparison of the first coil 101(1) and the kth coil 101(k) in Steps S13 through S19. However, a relative intensity correction coefficient and a relative phase shift amount between the adjacent coils are determined by making comparisons between the coils adjacent to one another. Then, the kth intensity correction coefficient I(k) and the kth phase shift amount $\phi(k)$ with the first coil 101(1) as the reference may be determined from the relative intensity correction coefficient and the relative phase shift amount.

EMBODIMENT 4

Figure 9:
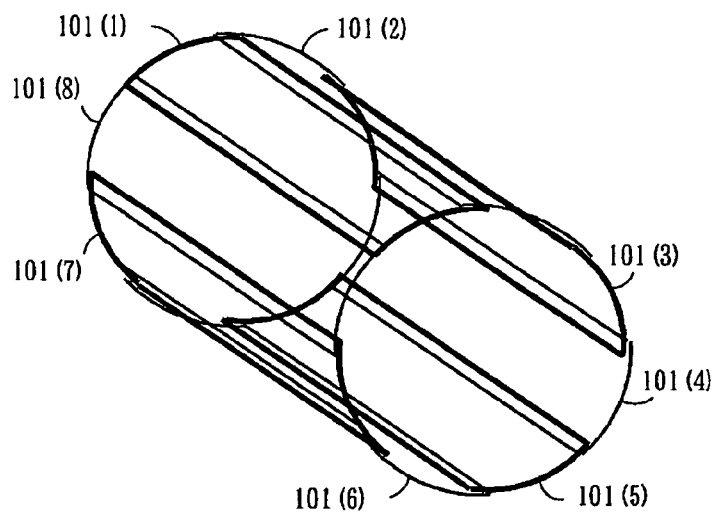
FIG. 9 is a perspective view illustrating a phased array coil according to an embodiment 4.

FIG. 9 is a perspective view of a phased array coil in which coils 101(1), 101(2), . . . , 101(8) identical in shape are disposed on a cylinder at equal angles.

Figure 10:
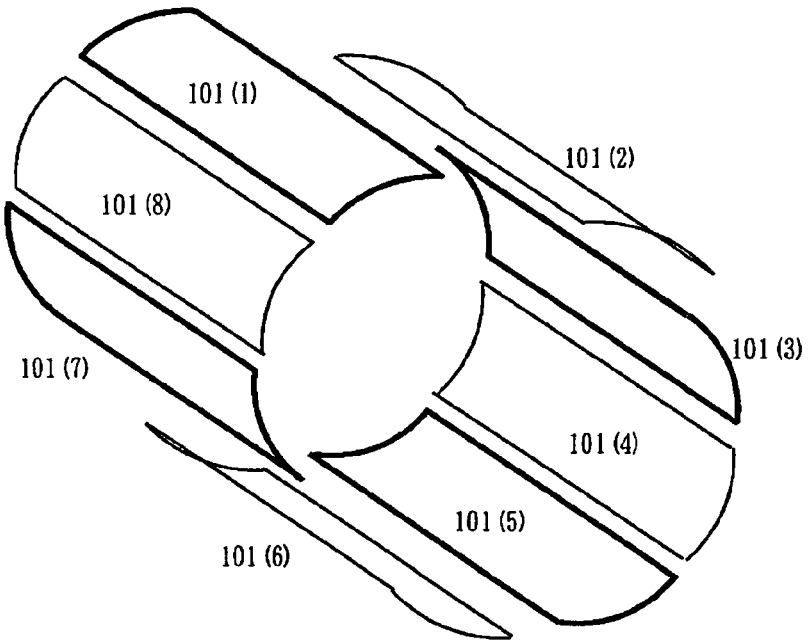
FIG. 10 is a perspective view showing respective coils according to the embodiment 4.

FIG. 10 is a perspective view showing the respective coils 101(1), 101(2), . . . , 101(8).

Incidentally, the ground positions of receiving terminals of the coils 101(1), 101(2), . . . , 101(8) are symmetrical in rotation.

Figure 11:
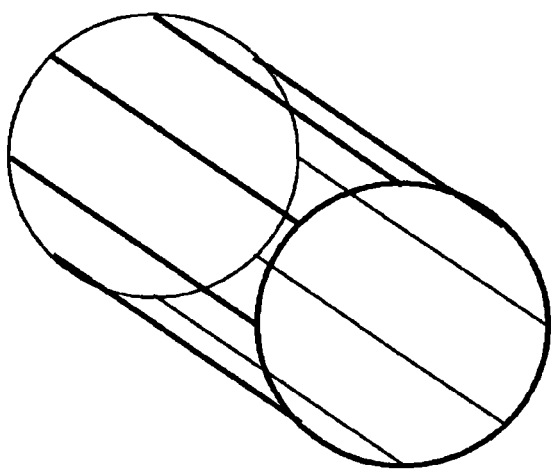
FIG. 11 is a conceptual diagram illustrating a bird cage coil emulated by the embodiment 4.

FIG. 11 is a conceptual diagram of one bird cage coil emulated by a process to be next described.

Figure 12:
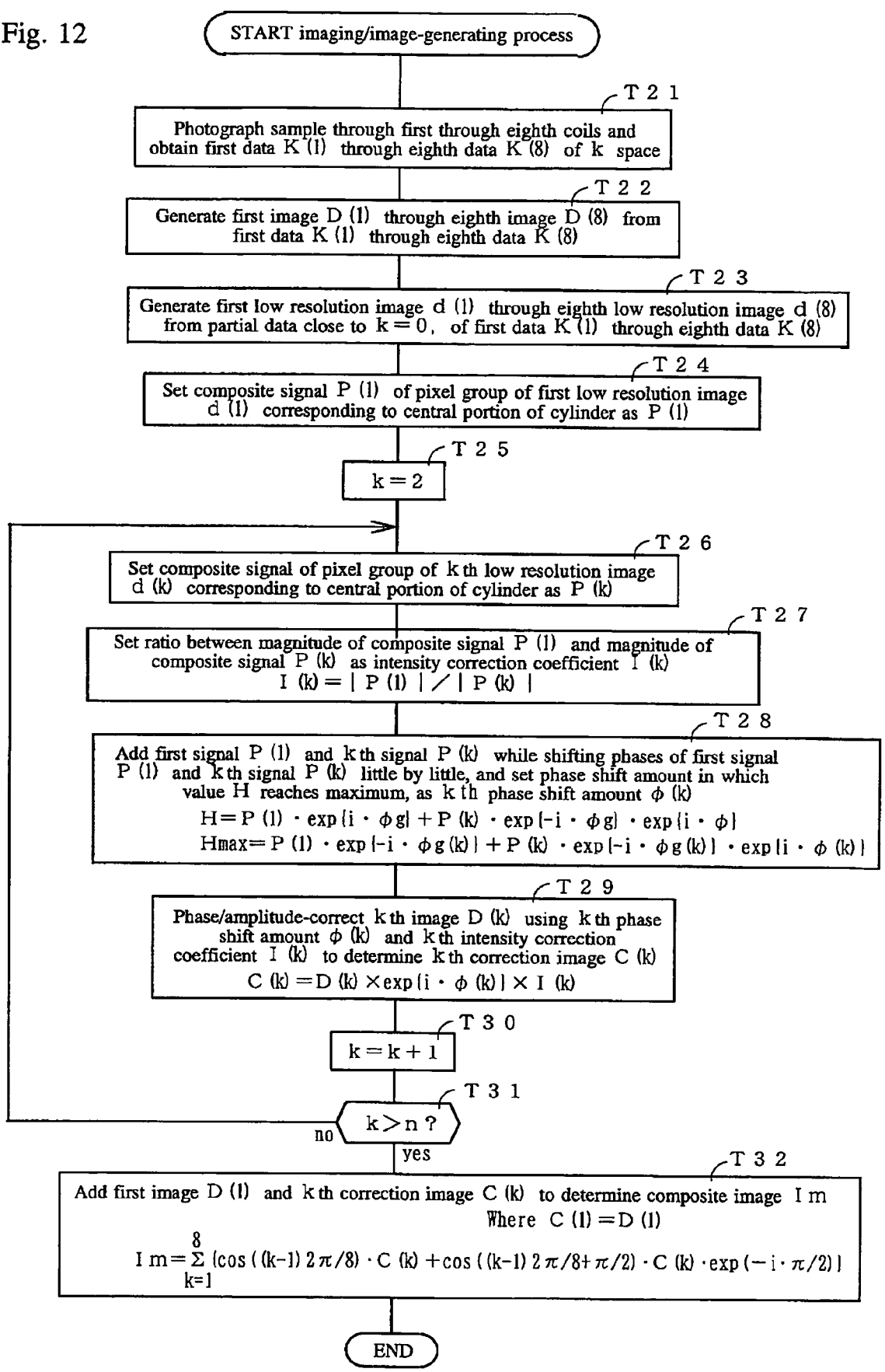
FIG. 12 is a flow chart showing an imaging/image-generating process according to the embodiment 4.

FIG. 12 is a flow chart showing an imaging/image-generating process according to an embodiment 4.

In Step T21, a sample or a body to be examined is imaged using the first coil 101(1), second coil 101(2), . . . , eighth coil 101(8), and first data K(1), second data K(2), . . . , eighth data K(8) for a k space are read into a computer 107.

In Step T22, a first image D(1), a second image D(2), . . . , an eighth image D(8) are reconstructed from the first data K(1), second data K(2), . . . , eighth data K(8). Incidentally, these images are complex images, and their pixel values are equivalent to vectors and have phases and magnitude.

In Step T23, a first low resolution image d(1), a second low resolution image d(2), . . . , an eighth low resolution image d(8) are reconstructed from partial data close to k=0 (equivalent to about 32 lines near k=0 in the case of a resolution of 256×256, for example), of the first data K(1), second data K(2), . . . , eighth data K(8). These images are complex images, and their pixel values are equivalent to vectors and have phases and magnitude.

Incidentally, although the use of the partial data close to k=0 provides resistance to noise, the first low resolution image d(1), second low resolution image d(2), . . . , eighth low resolution image d(8) may be reconstructed using all data.

Figure 13:
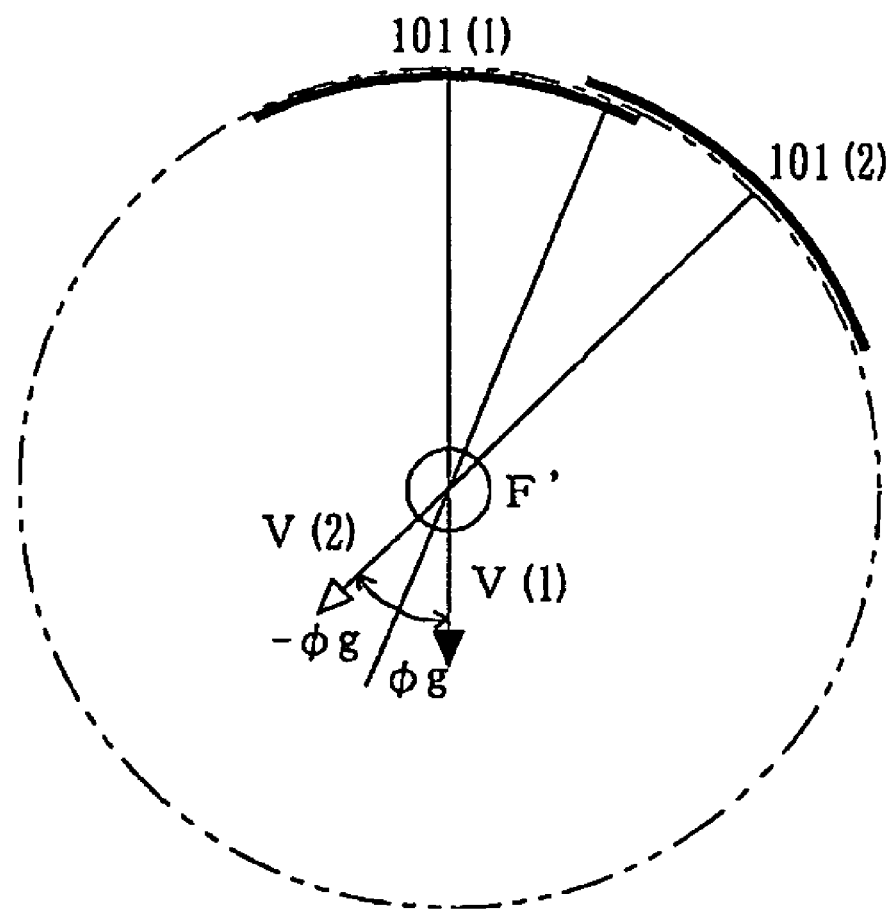
FIG. 13 is an explanatory view illustrating sensitivity vectors of coils.

In Step T24, a composite signal (vector obtained by adding vectors of respective pixels) of a pixel group (about 30×30 pixels in the case of a resolution of 256×256, for example) of the first low resolution image d(1) corresponding to a cylindrical central portion F' (i.e., portion located at an equal distance from the centers of the respective coils) in the case of k=2 as shown in FIG. 13 is defined or set as P(1).

In Step T25, a coil number counter is initially set to k=2.

In Step T26, a composite signal of a pixel group of the kth low resolution image d(k) corresponding to the cylindrical central portion F' as in the case of k=2 as shown in FIG. 13 is defined or set as P(k).

In Step T27, the ratio between the magnitude of the composite signal P(1) and that of the composite signal P(k) is defined or set as an intensity correction coefficient I(k).

$$I(k)=|P(1)|/|P(k)|$$

Meanwhile, there are phase differences between the composite signal P(1) of the first coil 101(1) and the composite signal P(k) of the kth coil 101(k) due to the following three factors.

(i) A phase difference developed due to the difference between a transmission line from the receiving terminal of the first coil 101(1) to the receiver 112(1) and a transmission line from the receiving terminal of the kth coil 101(k) to the receiver 112(k).

(ii) A phase difference developed due to the fact that an NMR signal is a rotating magnetic field and the first coil 101(1) and the kth coil 101(k) are different in position.

(iii) A phase difference developed due to the fact that the sensitivity vector V(1) of the first coil 101(1) and the sensitivity vector V(k) of the kth coil 101(k) are different in direction in the case of k=2 as shown in FIG. 13.

In order to emulate a large coil, there is a need to match time bases of currents flowing through the respective coils with one another. That is, there is a need to perform a phase correction so as to eliminate the phase differences of the above (i) and (ii) and hold the phase difference of the above (iii).

Thus, in step T28, when a phase shift amount for determining the combined phase difference of the above (i) and (ii) is defined as φ and a phase shift amount for determining the phase difference of the above (iii) is defined as φg, φ is changed 10° by 10° for example in a range of 0° through 360°, and φg is changed 2.5° by 2.5° in a range of 0° through 90° (difference in direction of sensitivity vector is less than 90°). Then, a phase shift amount φ in which the value H of the following expression reaches the maximum, is defined or set as a kth phase shift amount φ(k).

$$H=P(1)\cdot\exp\{i\cdot\phi g\}+P(k)\cdot\exp\{-1\cdot\phi g\}\cdot\exp\{i\cdot\phi\}$$

$$H\max=P(1)\cdot\exp\{i\cdot\phi g(k)\}+P(k)\cdot\exp\{-i\cdot\phi g(k)\}\cdot\exp\{i\cdot\phi(k)\}$$

Incidentally, when the value of φg is determined from the geometrical arrangement of the coils (when φg=22.5° is determined in FIG. 13, for example), the value thereof may be adopted and there is no need to change φg.

In Step T29, the respective pixel values of a kth image D(k) are phase/amplitude-corrected using the kth phase shift amount φ(k) and the kth intensity correction coefficient I(k) to obtain a kth correction image C(k).

$$C(k)=D(k)\times\exp\{i\cdot\phi(k)\}\times I(k)$$

In Step T30, the coil number counter k is incremented by "1".

If the coil number counter k≦n in Step T31, then the process returns to Step T26. If k>n, then the process proceeds to Step T32.

In Step T32, an M1 mode of the bird cage coil is equivalent to one in which a standing wave having one cycle stands on an end ring. Therefore, the first image D(1) and all corrected images are added (quadrature-combined) like the following expression to obtain a composite image Im.

$$Im=\Sigma\{\cos((k-1)2\pi/8)\cdot C(k)+\cos((k-1)2\pi/8+\pi/2)\cdot C(k)\cdot\exp(-1\cdot\pi/2)\}$$

where C(1)=D(1).

Here, (k−1)2π/8 indicate angles formed by the first coil 101(1) through eighth coil 101(8) as viewed from the center of the cylinder. The angle formed by the first coil 101(1) as viewed from the center of the cylinder is set as the reference.

The first term of the above expression is equivalent to an I channel for quadrature reception, and the second term is equivalent to a Q channel. Then, the process is terminated.

According to the imaging/image-generating process of the embodiment 4, an image having the degree of uniformity equivalent to the image generated from the data obtained by the bird cage coil shown in FIG. 11 can be generated.

Incidentally, the kth intensity correction coefficient I(k) and the kth phase shift amount φ(k) with the first coil 101(1) as the reference have been determined by the comparison between the first coil 101(1) and the kth coil 101(k) in Steps T25 through T31. However, a relative intensity correction coefficient and a relative phase shift amount between the adjacent coils are determined by making comparisons between the coils adjacent to one another. Then, the kth intensity correction coefficient I(k) and the kth phase shift amount φ(k) with the first coil 101(1) as the reference may be determined from the relative intensity correction coefficient and the relative phase shift amount.

EMBODIMENT 5

Coils employed in an embodiment 5 are assumed to be identical to those employed in the fourth embodiment.

Figure 14:
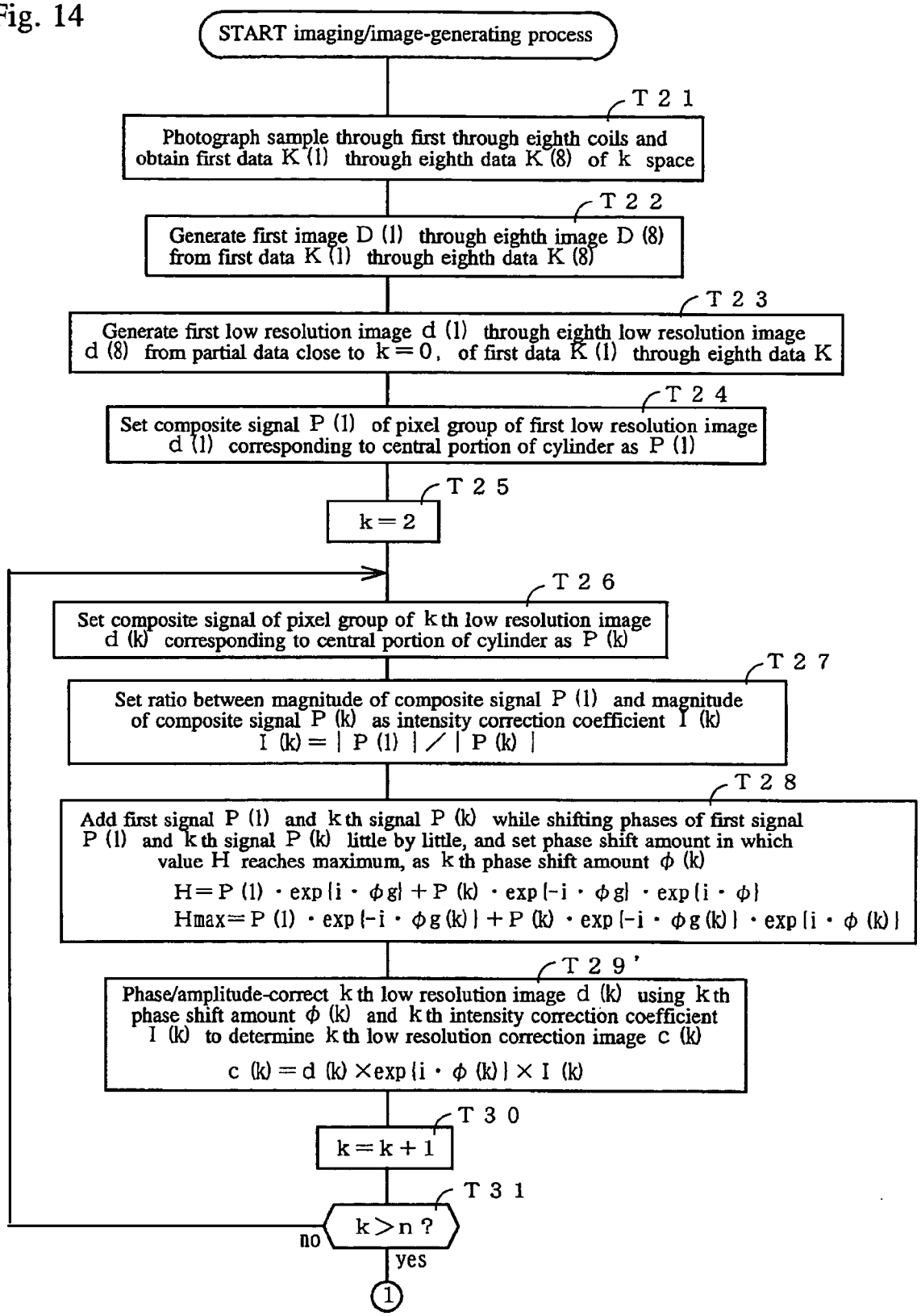
FIG. 14 is a flow chart depicting an imaging/image-generating process according to an embodiment 5.
Figure 15:
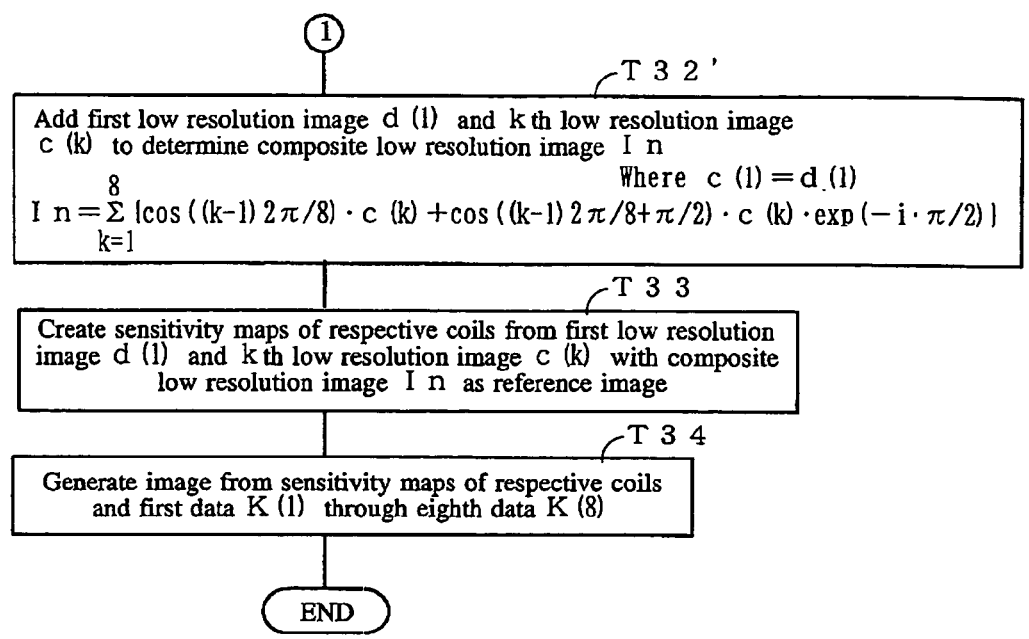
FIG. 15 is a flow chart following FIG. 14.

FIGS. 14 and 15 are flow charts showing an imaging/image-generating process according to the embodiment 5.

In Step T21, a sample or a body to be examined is imaged using a first coil 101(1), a second coil 101(2), ..., an eighth coil 101(8), and first data K(1), second data K(2), ..., eighth data K(8) for a k space are read into a computer 107.

In Step T22, a first image D(1), a second image D(2), ..., an eighth image D(8) are reconstructed from the first data K(1), second data K(2), ..., eighth data K(8). Incidentally, these images are complex images, and their pixel values are equivalent to vectors and have phases and magnitude.

In Step T23, a first low resolution image d(1), a second low resolution image d(2), ..., an eighth low resolution image d(8) are reconstructed from partial data close to k=0 (equivalent to about 32 lines near k=0 in the case of a resolution of 256×256, for example), of the first data K(1), second data K(2), ..., eighth data K(8). Incidentally, these images are complex images, and their pixel values are equivalent to vectors and have phases and magnitude.

In Step T24, a composite signal (vector obtained by adding vectors of respective pixels) of a pixel group (about 30×30 pixels in the case of a resolution of 256×256, for example) of the first low resolution image d(1) corresponding to a cylindrical central portion F' (i.e., portion located at an equal distance from the centers of the respective coils) in the case of k=2 as shown in FIG. 13 is defined or set as P(1).

In Step T25, a coil number counter is initially set to k=2.

In Step T26, a composite signal of a pixel group of the kth low resolution image d(k) corresponding to the cylindrical central portion F' as in the case of k=2 as shown in FIG. 13 is defined or set as P(k).

In Step T27, the ratio between the magnitude of the composite signal P(1) and that of the composite signal P(k) is defined or set as an intensity correction coefficient I(k).

$$I(k)=|P(1)|/|P(k)|$$

Meanwhile, there are phase differences between the composite signal P(1) of the first coil 101(1) and the composite signal P(k) of the kth coil 101(k) due to the following three factors.

(i) A phase difference developed due to the difference between a transmission line from the receiving terminal of the first coil 101(1) to the receiver 112(1) and a transmission line from the receiving terminal of the kth coil 101(k) to the receiver 112(k).

(ii) A phase difference developed due to the fact that an NMR signal is a rotating magnetic field and the first coil 101(1) and the kth coil 101(k) are different in position.

(iii) A phase difference developed due to the fact that the sensitivity vector V(1) of the first coil 101(1) and the sensitivity vector V(k) of the kth coil 101(k) are different in direction in the case of k=2 as shown in FIG. 13.

In order to emulate a large coil, there is a need to match time bases of currents flowing through the respective coils with one another. That is, there is a need to perform a phase correction so as to eliminate the phase differences of the above (i) and (ii) and hold the phase difference of the above (iii).

Thus, in Step T28, when a phase shift amount for determining the combined phase difference of the above (i) and (ii) is defined as φ, and a phase shift amount for determining the phase difference of the above (iii) is defined as φg, φ is changed 10° by 10° for example in a range of 0° through 360°, and φg is changed 2.5° by 2.5° in a range of 0° through 90° (difference in direction of sensitivity vector is less than 90°). Then, a phase shift amount φ in which the value H of the following expression reaches the maximum, is defined or set as a kth phase shift amount φ(k).

$$H=P(1)\cdot\exp\{i\cdot\phi g\}+P(k)\cdot\exp\{-1\cdot\phi g\}\cdot\exp\{i\cdot\phi\}$$

$$H\max=P(1)\cdot\exp\{i\cdot\phi g(k)\}+P(k)\cdot\exp\{-i\cdot\phi g(k)\}\cdot\exp\{i\cdot\phi(k)\}$$

Incidentally, when the value of φg is determined from the geometrical arrangement of the coils (when φg=22.5° is determined in FIG. 13, for example), the value thereof may be adopted and there is no need to change φg.

In Step T29', the respective pixel values of a kth low resolution image d(k) are phase/amplitude-corrected using the kth phase shift amount φ(k) and the kth intensity correction coefficient I(k) to obtain a kth correction low resolution image c(k).

$$c(k)=d(k)\times\exp\{i\cdot\phi(k)\}\times I(k)$$

In Step T30, the coil number counter k is incremented by "1".

If the coil number counter k≦n in Step T31, then the process returns to Step T26. If k>n, then the process proceeds to Step T32'.

In Step T32' of FIG. 15, an M1 mode of a bird cage coil is equivalent to one in which a standing wave having one cycle stands on an end ring. Therefore, the first low resolution image d(1) and all corrected images are added (quadrature-combined) like the following expression to obtain a composite low resolution image In.

$$In=\Sigma\{\cos((k-1)2\pi/8)\cdot c(k)+\cos((k-1)2\pi/8+\pi/2)\cdot c(k)\cdot\exp(-1\cdot\pi/2)\}$$

where c(1)=d(1).

Here, (k−1)2π/8 indicate angles formed by the first coil 101(1) through eighth coil 101(8) as viewed from the center of the cylinder. The angle formed by the first coil 101(1) as viewed from the center of the cylinder is set as the reference.

The first term of the above expression is equivalent to an I channel for quadrature reception, and the second term is equivalent to a Q channel.

In Step T33, sensitivity maps of the respective coils are created or generated from the first low resolution image d(1) through nth low resolution image d(n) with the composite low resolution image In as a reference image. For example, images obtained by dividing the respective pixel values of the first low resolution image d(1) through nth low resolution image d(n) by the sizes or magnitudes of respective pixels of the composite low resolution image In are set as sensitivity maps. Alternatively, images obtained by effecting smoothing processing on the divided images to remove noise therefrom are set as sensitivity maps.

In Step T34, an image is generated from the sensitivity maps of the first coil 101(1), second coil 101(2), ..., nth coil 101(n) and the first data K(1), second data K(2), ..., nth data K(n). This image generation can be performed using the following expression disclosed in Pruessmann K P, et al. Magn Reson Med 1999; 952-962.

$$(S^H\Psi^{-1}S)^{-1}S^H\Psi^{-1}A$$

where S indicate vectors in which the sensitivity maps of the respective coils are arranged in order. Ψ indicates a noise correlation matrix. When no noise correlation matrix is used, Ψ is defined as a unit matrix. A indicate data of the respective coils. This calculation is done every pixels. Then, the present process is terminated.

According to the imaging/image-generating process of the embodiment 5, an image having the degree of uniformity equivalent to the image generated from the data obtained by the bird cage coil shown in FIG. 11 and having a high SNR showing the advantage of the phased array coil can be generated.

Incidentally, the kth intensity correction coefficient I(k) and the kth phase shift amount φ(k) with the first coil 101(1) as the reference have been determined by the comparison between the first coil 101(1) and the kth coil 101(k) in Steps T25 through T31 referred to above. However, a relative intensity correction coefficient and a relative phase shift amount between the adjacent coils are determined by making comparisons between the coils adjacent to one another. Then, the kth intensity correction coefficient I(k) and the kth phase shift amount φ(k) with the first coil 101(1) as the reference may be determined from the relative intensity correction coefficient and the relative phase shift amount.

EMBODIMENT 6

The present invention can be applied even to data obtained by a pair of coils opposite to each other, which is normally used in SENSE.

Also the present invention is applicable even to a phased array coil in which a plurality of coils are arranged on a pot at equal angles in place of the placement of the plurality of coils on the cylinder.

Many widely different embodiments of the invention may be configured without departing from the spirit and the scope of the present invention. It should be understood that the present invention is not limited to the specific embodiments described in the specification, except as defined in the appended claims.

The invention claimed is:

1. An image generating method comprising the steps of:
    determining an intensity correction coefficient and a phase shift amount for each of n (≧2) coils based on at least one of an amplitude and a magnitude of a signal received by the respective n (≧2) coil;
    storing the intensity correction coefficients and the phase shift amounts corresponding to each of the n (≧2) coils;
    generating respective images from respective image data obtained by the n (≧2) coils;
    correcting intensities and phases of the respective images utilizing the respective intensity correction coefficients and the respective phase shift amounts; and
    adding the images to generate one composite image upon correcting the intensities and phases.

2. The image generating method according to claim 1, further comprising the steps of:
    inputting a test signal to portions corresponding to receiving terminals of the n coils.

3. The image generating method according to claim 1, further comprising the step of multiplying the images by weights based on the arrangements of the respective coils to thereby add the images.

4. An image generating method comprising the steps of:
    determining an intensity correction coefficient and a phase shift amount for each of n (≧2) coils based on at least one of an amplitude and a magnitude of a signal received by the respective n (≧2) coil;
    storing the intensity correction coefficients and the phase shift amounts corresponding to each of the n (≧2) coils;
    generating respective images from respective image data obtained by the n (≧2) coils;
    correcting intensities and phases of the respective images utilizing the respective determined intensity correction coefficients and phase shift amounts;
    adding the images to generate one composite image upon correcting the intensities and phases;
    creating sensitivity maps of the respective coils from the composite image and the respective images; and
    generating one image from the respective data and the respective sensitivity maps.

5. The image generating method according to claim 4, further comprising the steps of:
    generating respective low resolution images, using partial data in a low frequency region, of the data obtained by the n coils;
    correcting the intensities and phases of the respective low resolution images;
    adding the images together to generate one composite low resolution image; and
    creating sensitivity maps of the respective coils from the composite low resolution image and the low resolution images.

6. The image generating method according to claim 5, further comprising the steps of:
    comparing a first composite signal P(1) of pixel groups for a first low resolution image corresponding to an object to be photographed located at an equal distance from a first coil and kth (where k=2, . . . , n) coils, with a kth composite signal P(k) of pixel groups for a kth low resolution image to thereby determine intensity correction coefficients and phase shift amounts corresponding to the kth coils, the first composite signal P(1) and the kth composite signal each correspond to a different one of the respective signals received by the respective n (≧2) coils; and
    correcting the intensities and phases of the respective low resolution images, using the intensity correction coefficients and the phase shift amounts.

7. The image generating method according to claim 6, further comprising the step of determining each of the intensity correction coefficients from a ratio between magnitude of the first composite signal P(1) and magnitude of the kth composite signal P(k).

8. The image generating method according to claim 6, further comprising the steps of adding both the first composite signal P(1) and the kth composite signal P(k) while the phase of one thereof is being shifted, and setting a shift amount in which a value reaches the maximum, as the respective phase shift amount of the one being shifted.

9. An MRI apparatus comprising:
    n (≧2) coils;
    a correction value acquiring device which determines an intensity correction coefficient and a phase shift amount for each of the n (≧2) coils based on at least one of an amplitude and a magnitude of a signal received by the respective n (≧2) coil;

a correction value storing device which stores the intensity correction coefficients and the phase shift amounts corresponding to each of the n (≧2) coils;

an image reconstructing device which generates respective images from respective image data obtained by the n (≧2) coils;

a correcting device which corrects the intensities and phases of the respective images utilizing the respective intensity correction coefficients and the respective phase shift amounts to generate a plurality of post-correction images; and a composite image generating device which adds the post-correction images to generate one composite image.

10. The MRI apparatus according to claim 9, wherein the composite image generating device multiplies the images by weights based on the arrangements of the respective coils to thereby add the images.

11. An MRI apparatus comprising:

n (≧2) coils;

a correction value acquiring device which determines an intensity correction coefficient and a phase shift amount for each of n (≧2) coils based on at least one of an amplitude and a magnitude of a signal received by the respective n (≧2) coil;

a correction value storing device which stores the intensity correction coefficients and the phase shift amounts corresponding to each of the n (≧2) coils;

an image reconstructing device which generates respective images from respective image data obtained by the n (≧2) coils;

a correcting device which corrects the intensities and phases of the respective images utilizing the respective intensity correction coefficients and the respective phase shift amounts to generate a plurality of post-correction images;

a composite image generating device which adds the post-correction images to generate one composite image;

a sensitivity map creating device which creates sensitivity maps of the respective coils from the composite image and the respective images; and an image generating device which generates one image from the respective data and the respective sensitivity maps.

12. The MRI apparatus according to claim 11, wherein the image reconstructing device generates respective low resolution images, using partial data in a low frequency region, of the data obtained by the n coils, the correcting device corrects the intensities and phases of the respective low resolution images, the composite image generating device adds the post-correction images to generate one composite low resolution image, and the sensitivity map generating device creates sensitivity maps of the respective coils from the composite low resolution image and the respective low resolution images.

13. The MRI apparatus according to claim 12, further comprising correction value acquiring device which compares a first composite signal P(1) of pixel groups for a first low resolution image corresponding to an object to be photographed located at an equal distance from a first coil and kth (where k=2, . . . , n) coils, with a kth composite signal P(k) of pixel groups for a kth low resolution image to thereby acquire intensity correction coefficients and phase shift amounts corresponding to the kth coils, wherein the correcting device corrects the intensities and phases of the respective images, using the acquired phase shift amounts and intensity correction coefficients, the first composite signal P(1) and the kth composite signal each correspond to a different one of the respective signals received by the respective n (≧2) coils.

14. The MRI apparatus according to claim 13, wherein the correction value acquiring device determines each of the intensity correction coefficients from a ratio between magnitude of the first composite signal P(1) and magnitude of the kth composite signal P(k).

15. The MRI apparatus according to claim 13, wherein the correction value acquiring device adds both the first composite signal P(1) and the kth composite signal P(k) while the phase of one thereof is being shifted, and sets a shift amount in which a value reaches the maximum, as the respective phase shift amount of the one being shifted.

* * * * *